(12) United States Patent
Oosterlaken et al.

(10) Patent No.: US 12,183,602 B2
(45) Date of Patent: Dec. 31, 2024

(54) SUBSTRATE PROCESSING APPARATUS FOR PROCESSING SUBSTRATES

(71) Applicant: ASM IP Holding B.V., Almere (NL)

(72) Inventors: Theodorus Oosterlaken, Oudewater (NL); Chris de Ridder, Hoogland (NL)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/235,467

(22) Filed: Aug. 18, 2023

(65) Prior Publication Data

US 2023/0395405 A1 Dec. 7, 2023

Related U.S. Application Data

(63) Continuation of application No. 17/356,900, filed on Jun. 24, 2021, now Pat. No. 11,735,445, which is a continuation of application No. 16/176,517, filed on Oct. 31, 2018, now Pat. No. 11,087,997.

(51) Int. Cl.

| | |
|---|---|
| *H01L 21/677* | (2006.01) |
| *B65G 47/90* | (2006.01) |
| *F27D 3/00* | (2006.01) |
| *F27D 5/00* | (2006.01) |
| *F27D 7/06* | (2006.01) |
| *H01L 21/67* | (2006.01) |

(52) U.S. Cl.
CPC ........ *H01L 21/67161* (2013.01); *B65G 47/90* (2013.01); *F27D 3/0084* (2013.01); *F27D 5/0037* (2013.01); *F27D 7/06* (2013.01); *H01L 21/67017* (2013.01); *H01L 21/67109* (2013.01); *H01L 21/67126* (2013.01); *H01L 21/67196* (2013.01); *H01L 21/67742* (2013.01); *H01L 21/67766* (2013.01); *B65G 2201/0297* (2013.01); *H01L 21/67769* (2013.01)

(58) Field of Classification Search
CPC ............ H01L 21/67161; H01L 21/67742
See application file for complete search history.

(56) References Cited

U.S. PATENT DOCUMENTS

| | | | |
|---|---|---|---|
| 5,855,726 | A | 1/1999 | Soraoka et al. |
| 6,481,945 | B1 | 11/2002 | Hasper et al. |
| 6,663,332 | B1 | 12/2003 | Sluijk et al. |
| 9,111,972 | B2 | 8/2015 | Takeshita et al. |
| 11,062,918 | B2 | 7/2021 | Kamimura et al. |
| 11,735,445 | B2 * | 8/2023 | Oosterlaken ...... H01L 21/67017 414/180 |
| 2003/0168948 | A1 | 9/2003 | Yamagishi et al. |

(Continued)

FOREIGN PATENT DOCUMENTS

| | | |
|---|---|---|
| JP | H1050800 A | 2/1998 |
| JP | 2000068355 A | 3/2000 |
| WO | 2015026230 A1 | 2/2015 |

*Primary Examiner* — Jonathan Snelting
(74) *Attorney, Agent, or Firm* — Snell & Wilmer L.L.P.

(57) ABSTRACT

The disclosure relates to substrate processing apparatus, with a first and second reactor, each reactor configured for processing a plurality of substrates; and, a substrate handling robot constructed and arranged to transfer substrates between a substrate cassette at a substrate transfer position and the first and second reactor. The apparatus is constructed and arranged with a maintenance area between the first and second reactors to allow maintenance of the reactors from the maintenance area to both the first and second reactor.

20 Claims, 4 Drawing Sheets

(56) References Cited

U.S. PATENT DOCUMENTS

| | | |
|---|---|---|
| 2004/0037675 A1 | 2/2004 | Zinger et al. |
| 2007/0295274 A1 | 12/2007 | Webb et al. |
| 2010/0186669 A1 | 7/2010 | Shin et al. |
| 2011/0041764 A1 | 2/2011 | Webb et al. |
| 2013/0202387 A1 | 8/2013 | Hiroki |
| 2015/0144060 A1 | 5/2015 | Park |
| 2015/0303079 A1 | 10/2015 | Oosterlaken et al. |

\* cited by examiner

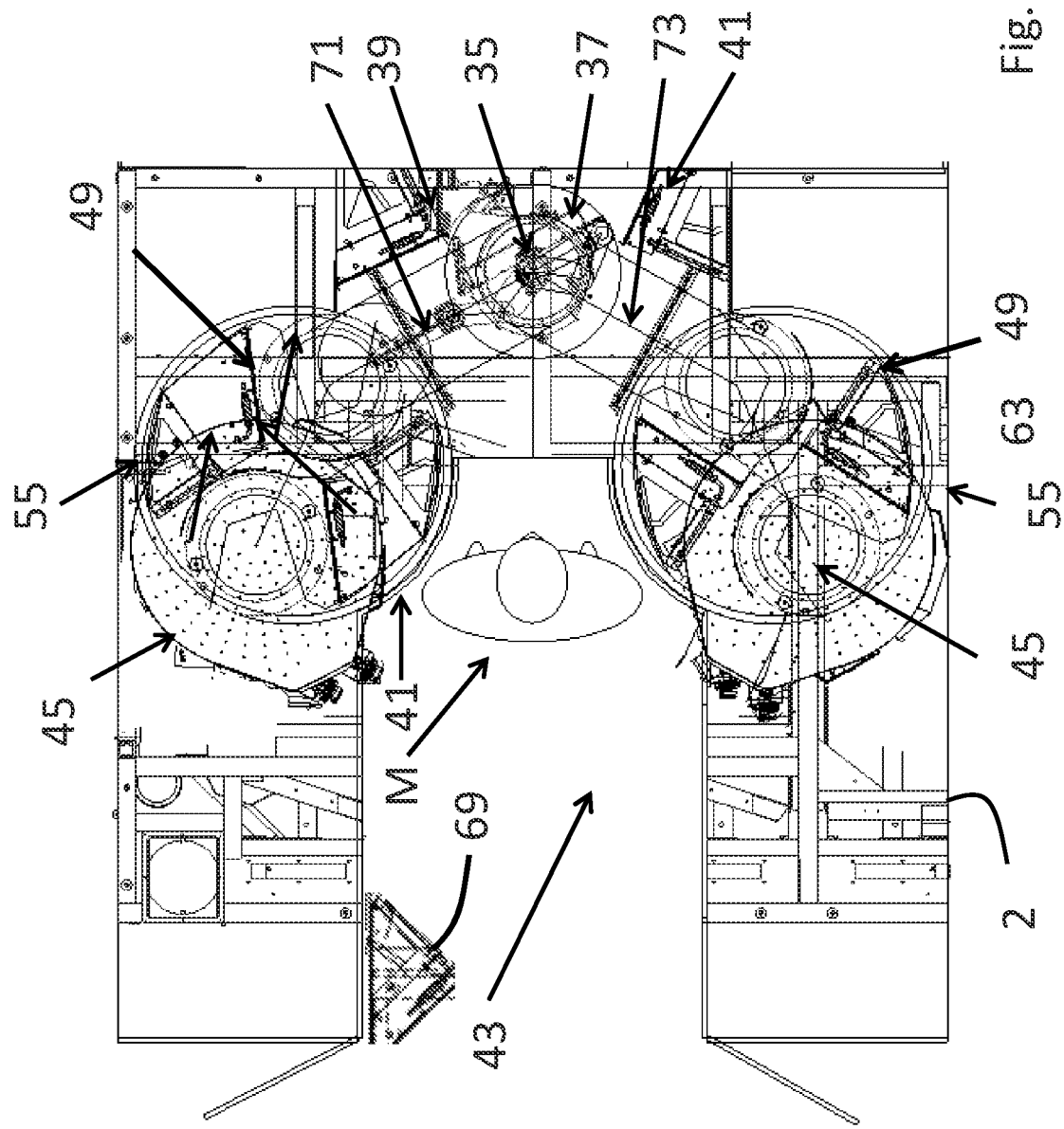

SUBSTRATE PROCESSING APPARATUS FOR PROCESSING SUBSTRATES

CROSS-REFERENCE TO RELATED APPLICATIONS

This application is a continuation of, and claims priority to, U.S. patent application Ser. No. 17/356,900 filed Jun. 24, 2021, titled SUBSTRATE PROCESSING APPARATUS FOR PROCESSING SUBSTRATES; which is a continuation of U.S. patent application Ser. No. 16/176,517 filed Oct. 31, 2018 titled SUBSTRATE PROCESSING APPARATUS FOR PROCESSING SUBSTRATES, the disclosures of which are hereby incorporated by reference in their entirety.

FIELD

The present disclosure generally relates to a substrate processing apparatus for processing a plurality of substrates. More particularly, the disclosure relates to a substrate processing apparatus, comprising:
a first and second reactor, each reactor configured for processing a plurality of substrates; and,
a substrate handling robot constructed and arranged to transfer substrates.

BACKGROUND

For feeding cassettes which accommodate a plurality of substrates to the substrate processing apparatus a cassette handler may transfer substrate cassettes between a cassette in-out port, a substrate transfer position and/or a storage device. The storage device may comprise a cassette storage carousel for storing a plurality of cassettes. The substrate handling robot may be constructed and arranged to transfer substrates between a cassette at the substrate transfer position and a substrate rack in a lower region of the apparatus.

The lower region may, optionally, be provided with a rack conveyor which may include a carousel or rotatable arm on which the rack may be positioned. By rotating the carousel or rotatable arm, the rack may be brought from an unloading and/or loading position to a treatment position under the first or second reactor. An elevator may be provided in the lower region to lift the rack with substrates into the reactor or to lower a rack with processed substrates from the reactor. During treatment in the reactor, the rack and the substrates accommodated therein may be raised in temperature. With the lift, the carousel or rotatable arm, a substrate rack may be removed from the reactor to cool down after treatment.

Substrate processing apparatus may have many components that may require maintenance. Since there is limited space in a clean room manufacturing site where the processing apparatus may be used the space for maintenance may be limited.

SUMMARY OF THE INVENTION

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

According to an objective it may be desirable to provide an apparatus which is easy to maintain on a small footprint.

Accordingly, there may be provided a substrate processing apparatus, comprising:
a first and second reactor, each reactor configured for processing a plurality of substrates; and,
a substrate handling robot constructed and arranged to transfer substrates. The substrate handling robot may transfer substrates between a substrate cassette at a substrate transfer position and the first and second reactor. The apparatus may be constructed and arranged with a maintenance area between the first and second reactors to allow maintenance from the maintenance area to both the first and second reactor.

According to a further embodiment there may be provided a substrate processing apparatus, comprising:
a housing with a back wall;
a first and second reactor, each reactor configured for processing a plurality of substrates; and,
a substrate handling robot constructed and arranged to transfer substrates between a substrate cassette at a substrate transfer position and the first and second reactor. The substrate handling robot may be constructed and arranged adjacent to a handler door to allow maintenance of the substrate handling robot through the handler door by a person standing on a maintenance area. The two reactors may be constructed and arranged adjacent to the same maintenance area to allow maintenance of the reactor from the same maintenance area.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

FIG. 2c shows a schematic top view of a portion of the furnace of FIG. 1 during maintenance to a substrate handling robot.

DETAILED DESCRIPTION OF THE FIGURES

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "substrate" or "wafer" may refer to any underlying material or materials that may be used, or upon which, a device, a circuit, or a film may be formed. The term "semiconductor device structure" may refer to any portion of a processed, or partially processed, semiconductor structure that is, includes, or defines at least a portion of an active or passive component of a semiconductor device to be formed on or in a semiconductor substrate. For example, semiconductor device structures may include, active and passive components of integrated circuits, such as, for example, transistors, memory elements, transducers, capacitors, resistors, conductive lines, conductive vias, and conductive contact pads.

Figure 1:
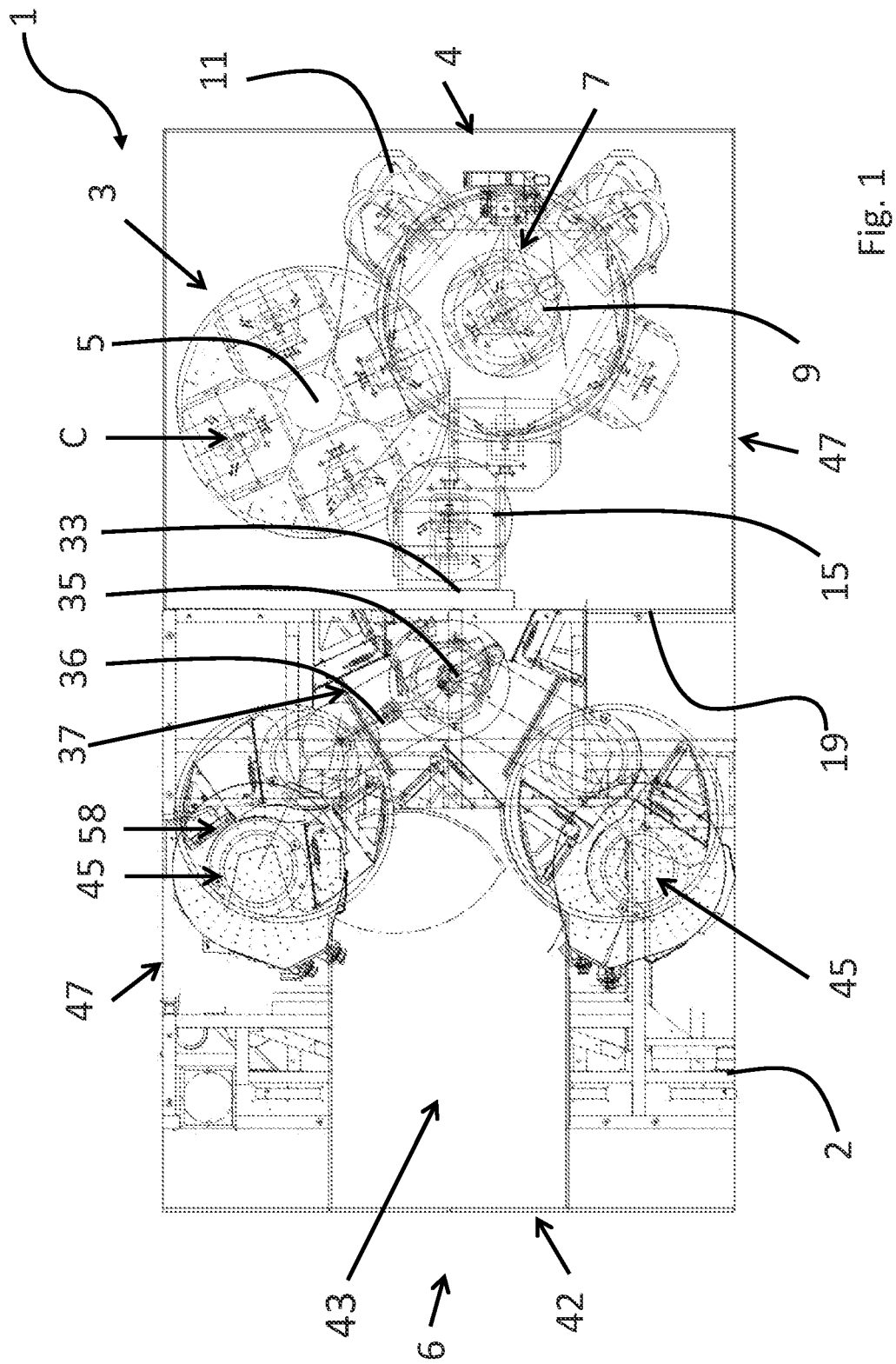
FIG. 1 shows a schematic top view of an example of the furnace according to an embodiment.

FIG. 1 shows a schematic top view of an example of the substrate processing apparatus, e.g., furnace 1 according to an embodiment. The furnace 1 comprises a housing 2 with a front wall 4 and a back wall 6.

The furnace 1 may comprise a storage device such as a cassette storage carousel 3 for storing a plurality of wafer cassettes C which wafer cassettes each accommodate a plurality of substrates. The cassette storage carousel 3 may comprise a number of platform stages for supporting cassettes. The platform stages may be connected to a central support which is mounted rotatable around a vertical axis 5. Each platform stage is configured for accommodating a number of cassettes C. A drive assembly is operatively connected to the central support for rotating the central support with the number of platform stages around the vertical axis 5.

The furnace 1 may have a cassette handler 7 having a cassette handler arm 9 configured to transfer cassettes C between the cassette storage carousel 3, a cassette in-out port 11 adjacent the front wall 4 of the housing 2 of the furnace 1, and/or a substrate transfer position 15. The cassette handler 7 may comprise an elevating mechanism to reach to the cassettes at different height. Each platform stage for storing cassettes may have a cut-out therein the cut-out sized and shaped to allow the cassette handler arm 9 to pass vertically there through and to allow the platform stage to support a cassette C thereon.

An internal wall 19 separating the cassette handler 7 and the substrate handling robot 35 may be provided. The wall may have a closable substrate access opening 33 adjacent the substrate transfer position 15 which may be constructed and arranged to also open the cassette. More information with respect to the closeable substrate access opening 33 for opening cassettes may be gleaned from U.S. Pat. No. 6,481,945 incorporated herein by reference. The substrate transfer position 15 may be provided with a cassette turntable to turn the cassette C and/or to press it against the closeable substrate access opening 33.

The substrate processing apparatus may comprise a substrate handling robot 35 provided with a substrate handling arm 36 to transfer substrates from a cassette C positioned on the substrate transfer position 15 through the closeable substrate access opening 33 to a substrate rack and vice versa. The furnace may comprise a substrate handling chamber 37 in which the substrate handling robot 35 is accommodated.

The housing 2 may have a first and second side wall 47 extending over the full length of the furnace 1. The distance between the sidewalls 47 of the furnace which may define the width of the apparatus may be between 190 and 250 cm, preferably between 210 and 230 cm and most preferably around 220 cm. Maintenance of the furnace 1 may be performed from the backside 6 or front side 4 of the furnace so that there may be no need for doors in the side walls 47.

With the construction of the sidewalls 47 without doors multiple furnaces 1 may be positioned side by side in a semiconductor fabrication plant. The sidewall of adjacent furnaces may thereby be positioned very close together, or even against each other. Advantageously, the multiple furnaces may form a wall with the front side 4 of the furnaces 1 interfacing with a cassette transport device in a very clean environment of a so called "clean room" having very strict requirements for particles. The back side 6 of the furnace 1 may interface with a maintenance alley which may have less strict requirements for particles than the front side 4.

The furnace 1 may be provided with a first and a second reactor 45 for processing a plurality of substrates. Using two reactors may improve the productivity of the furnace 1. The substrate processing apparatus in top view may be configured in a substantial U-shape. The first and second reactors 45 may be constructed and arranged in the legs. The first and second reactors 45 may be provided in the lower part of the legs of the U-shape. A maintenance area 43 may be constructed and arranged between the legs of the U-shape. The distance between the two legs of the U-shape may be between 60 and 120 cm, more preferably between 80 and 100 cm and most preferably around 90 cm to allow enough space for a maintenance worker. A back door 42 may be provided between the legs of the U-shape to close off the maintenance area 43 when not in use. The substantial U-shape may include a V-shape as well.

Figure 2A:
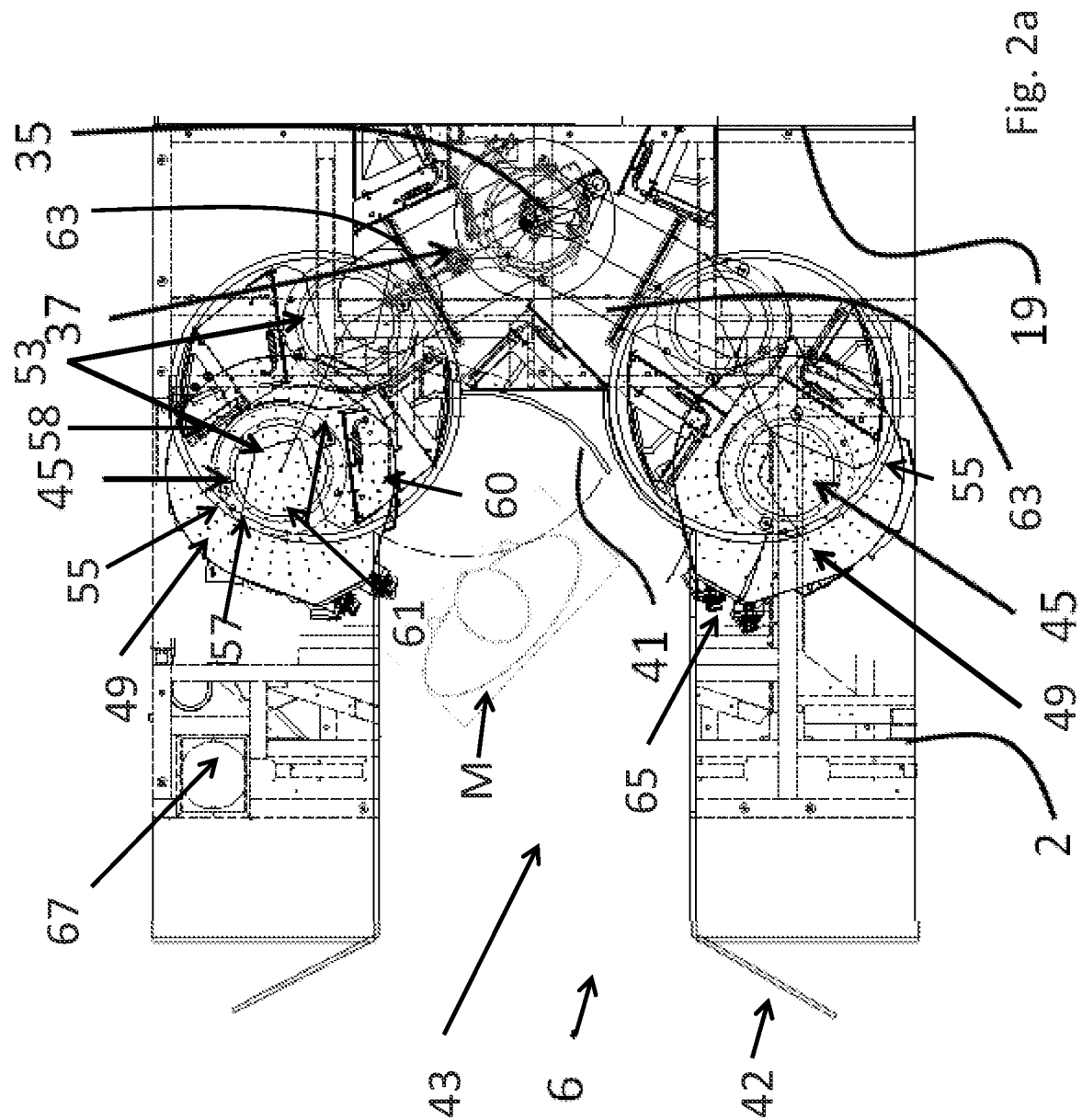
FIG. 2a shows a schematic top view of a portion of the furnace of FIG. 1 during maintenance to a reactor.

FIG. 2a shows a schematic top view of a back portion of the furnace of FIG. 1 during maintenance with the back doors 42 opened. The apparatus may be constructed and arranged to allow maintenance of the reactors 45 from the maintenance area 43 to both the first and second reactor by a maintenance worker M. For example, for maintenance on heating wires, heating sensors, and/or processing gas interfaces 65 (outlets and/or inlets) by the maintenance worker M. The two reactors 45 may be constructed and arranged adjacent to the same maintenance area 43 to allow maintenance of both reactors 45 from the same maintenance area 43. A reactor door 41 may be opened to allow maintenance of the reactor 45.

A maintenance worker M therefore may not enter the housing 2 of the furnace 1 for maintenance work on the reactor 45. Risk of injury of the maintenance worker M and/or contamination of the lower region and/or the reactor 45 may therefore be minimized. Maintenance from outside the housing may also improve the speed and/or accuracy of the maintenance. By using the same maintenance area for both reactors 45 the total footprint of the apparatus may be reduced.

The reactors 45 may be provided in a treatment module 49 which also may include the lower region of the furnace 1 provided with an elevator configured to transfer a rack with substrates between the lower region and the reactor 45. The elevator may be constructed and arranged in the legs of the U-shape as well. A gate valve 63 may be provided between the substrate handler 35 and the lower region of the treatment modules 49 creating a mini environment in the lower region.

A rack conveyor 55 for conveying the rack may be provided in the lower region of the furnace. The rack conveyor 55 may comprise two accommodations 57 for racks 53. Alternatively, the rack conveyor may comprise three or four accommodations for racks. The rack conveyor 55 may be constructed and arranged in the legs and bottom part of the U-shape. The rack conveyor 55 may be constructed and arranged to horizontally transfer racks 53 between a plurality of rack positions within the lower region.

Accommodation 57 may be a cooling down accommodation for cooling down a rack with just processed hot substrates. The cooling down accommodation may be provided with a gas inlet 58 and a gas outlet 60. The gas inlet 58 and the gas outlet 60 may be fluidly connected to a pump to create a gas flow through the mini environment in the lower region. A heat exchanger may be provided to cool the gas flow and to speed up the cooling down of the rack in the cooling down accommodation. The gas inlet 58 and the gas outlet 60 may be constructed and arranged to create a horizontal gas flow through the minienvironment for cooling. Alternatively, the gas inlet 58 and the gas outlet 60 may be constructed and arranged to create a downward gas flow through the minienvironment to reduce particle contamination.

The module 49 may be provided with an elevator configured to transfer a rack with substrates between a lower region of the furnace and the reactor 45. The elevator may comprise a rack support arm having a bearing surface configured to support a substrate rack. The rack conveyor 55 may have a support platform having a cut-out 61 therein. The cut-outs 61 may be sized and shaped to allow the bearing surface of the rack support arm to translate vertically there through and to allow the platform to support a substrate rack. The rack conveyors 55 may be rotatable to transport the rack horizontally from a position close to the substrate handling robot 35 to a position underneath the reactor 45.

The treatment module 49 may be provided with a reactor door 41 openable in a direction of the maintenance area 43. Both treatment modules 49 may be provided with a separate reactor door 41 to allow maintenance of each reactor 55 from the same maintenance area 43 by the maintenance worker M. The reactor door 41 of the treatment module 49 may also allow maintenance of the lower region of the furnace from the same maintenance area 43 for maintenance on the rack conveyors 55, gas inlet 58, gas outlet 60, gate valves 63 elevator and/or rack.

Alternatively, two reactor doors may be provided per treatment module; a first reactor door for giving access to the reactor 55 and a second reactor door for giving access to the lower region of the furnace. For example, for maintenance on the rack conveyors 55, gas inlet 58, gas outlet 60, gate valves 63 elevator and/or rack access to the lower region of the furnace may be required.

A maintenance worker M therefore may not need to enter the housing 2 of the furnace 1 for maintenance work inside the treatment module 49. Risk of injury of the maintenance worker M and/or contamination of the inside of the treatment module may thereby be minimized.

Gate valves 63 may be provided between the substrate handling chamber 37 and the treatment modules 49. The gate valves 63 may be closed during maintenance to the substrate handling robot 35 so that the treatment modules may continue working while maintaining the substrate handling robot 35.

Maintenance on one of the reactors 45 may not interfere with the other one of the reactors 45 since both are constructed as separate units. The gate valves 63 may be closed during maintenance of one reactor so that the other reactor and the substrate handling robot 35 may continue working.

The reactors 45 may have processing gas interfaces 65 (outlets and/or inlets) which may be connected to a gas exhaust pipe or a process gas delivery system. The processing gas interfaces 65 may be provided adjacent the maintenance area 43 so as to make them easy accessible during maintenance.

The process gas delivery system may be provided (partly) in a gas cabinet 67 constructed and arranged to provide process gas to the first and/or second reactor 45. The gas cabinet may be provided near a top of the legs of the U-shape. Providing the gas cabinet near the top of the U-shape provides easy access for maintenance. Further this place provides flexibility if the gas cabinet needs to be adjusted or enlarged since there is space at the back of the apparatus where no critical components as substrate handlers or cassette handlers are present.

The gas exhaust pipe may be constructed and arranged to remove process gas from at least one of the first and the second reactors and may also be provided near a top of the legs of the U-shape. Providing the gas exhaust pipe in the legs of the U-shape provides easy access for maintenance. The gas exhaust pipe may be provided with pumps and scrubbers which may require regular maintenance. Further this place provides flexibility if the gas exhaust pipe needs to be adjusted or extended since there is space at the back of the apparatus where no critical components such as substrate handling robots and/or cassette handlers are present.

Figure 2B:
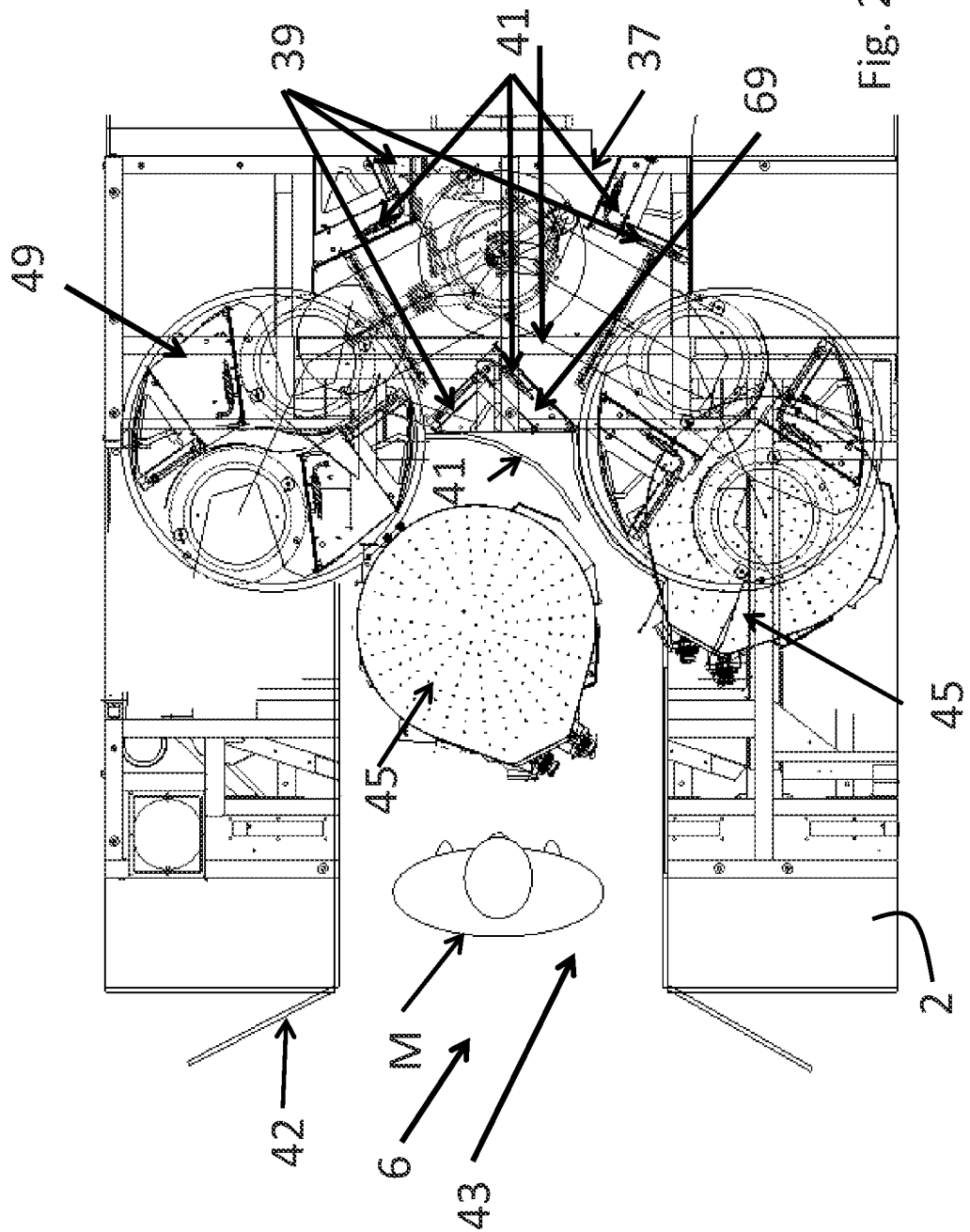
FIG. 2b shows a schematic top view of a portion of the furnace of FIG. 1 during replacement of a reactor.

FIG. 2b shows a schematic top view of a back portion of the furnace of FIG. 1 during maintenance with the back doors 42 opened. Maintenance to the reactors may include the replacement of large components such as reactors, reactor tubes, substrate racks, heater elements, doors, pumps and/or valves.

A maintenance worker M standing on a maintenance area 43 outside the housing 2 may remove the reactor 45 for example from the apparatus. Such large components including the tooling to transport them safely may require a large maintenance area 43. Since the same maintenance area 43 may be used for both reactors 45 the footprint of the maintenance area 43 may be reduced. The opening at the back side 6 of the apparatus easily allows the transportation of even big components, such as the reactor 45 out of the apparatus.

A substrate handling chamber 37 in which the substrate handling robot is accommodated may be provided with a handler door 69.

FIG. 2c shows a schematic top view of a portion of the furnace 1 of FIG. 1 during maintenance to a substrate handling robot 35. The handler door 69 may be a removable plate or portion of the apparatus. The maintenance worker M may remove the handler door 69 from the housing 2 to get access to the substrate handling robot 35. He may put it somewhere in the back of the maintenance area 43. The reactor door 41 may be closed to allow access to the handler door 69 and the substrate handling robot 35.

The substrate handling chamber 37 in which the substrate handling robot is accommodated may be a minienvironment enclosure. The substrate handling chamber 37 may be provided with a gas inlet 39 and a gas outlet 41 which may be fluidly connected to a pump to provide a gas flow through the substrate handling chamber 37. The gas inlet 39 and the gas outlet 41 may be constructed and arranged to create a horizontal gas flow in the substrate handling chamber 37. The gas inlet 39 and the gas outlet 41 may also be constructed in the handler door 69. FIG. 2b shows how three gas inlets 39 and gas outlets 41 may be provided in the handling chamber 37 (including the handler door 69).

Alternatively, the gas inlet 39 may be provided below the gas outlet 41 to create a (partial) down flow in the substrate handling chamber 37. A down flow may be preferable because particle contamination may be minimized with down flow.

The substrate handling robot 35 may be constructed and arranged in the bottom of the U-shape in which the apparatus is arranged. The handler door 69 may be provided in the bottom of the U-shape to provide access to the substrate handling robot 35 from the maintenance area 43 between the legs of the U-shape. The handler door 69 may be provided in the wall of the housing to give access to the substrate handling chamber 37 adjacent to the substrate handling robot 35 to allow maintenance of the robot 35 through the handler door.

A maintenance worker M standing on a maintenance area 43 outside the housing 2 therefore doesn't need to enter the minienvironment of the substrate handling chamber 37 of the furnace 1 for maintenance work on the substrate handling robot 35. Risk of injury of the maintenance worker and/or contamination of the substrate handling chamber 37 may thereby be reduced. Maintenance without entering the minienvironment may also improve the "speed" and/or accuracy in which the maintenance may be performed.

The substrate handling robot 35 may be constructed and arranged to transfer substrates in a first direction 71 towards the first treatment module 49 and in a second direction 73 towards the second treatment module 49. The first and second direction 71, 73 may have an angle of 90 to 180, preferably 110 to 130 and most preferably around 120 degrees with each other.

The substrate handling robot 35 may be constructed and arranged to transfer the substrate in a third direction to the substrate transfer position 15 (in FIG. 1). The first, second and third direction may have angles of 90 to 180, preferably 110 to 130, and most preferably around 120 degrees with each other.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A substrate processing apparatus, comprising:
   a housing comprising a front wall and a back wall, with a first side wall and a second side wall extending between the front wall and the back wall;
   a first and second module disposed within the housing;
   a substrate handling robot disposed within the housing, the substrate handling robot constructed and arranged to transfer substrates;
   a maintenance area between the respective side walls and between a back wall opening in the back wall and the first and second modules, with the substrate handling robot provided adjacent the maintenance area; and
   a handler door forming part of the housing,
   wherein the back wall in top view comprises a first leg and a second leg,
   wherein the maintenance area is between the first leg and the second leg, and
   wherein substrate processing apparatus is constructed and arranged to allow maintenance access by a maintenance worker standing in the maintenance area to the first module, the second module, and the substrate handling robot.

2. The substrate processing apparatus according to claim 1, wherein at least one of the first and second modules is provided in a lower part of the first leg of the substrate processing apparatus.

3. The substrate processing apparatus according to claim 1, further comprising a gas cabinet constructed and arranged to provide process gas to at least one of the first and the second modules.

4. The substrate processing apparatus according to claim 1, further comprising a gas exhaust pipe constructed and arranged to remove process gas from at least one of the first and the second modules.

5. The substrate processing apparatus according to claim 1, further comprising a back door between the first leg and the second leg, wherein the back door opens to at least partially define the back wall opening.

6. The substrate processing apparatus according to claim 1, comprising a module door openable in a direction of the maintenance area for allowing maintenance access by the maintenance worker to the first module from the maintenance area.

7. The substrate processing apparatus according to claim 1, wherein the handler door is removable.

8. The substrate processing apparatus according to claim 1, wherein the first side wall and the second side wall are parallel to each other and are perpendicular to the front wall.

9. The substrate processing apparatus according to claim 1, wherein a width of the housing is between 200 and 240 cm.

10. The substrate processing apparatus according to claim 1, wherein the maintenance area has a width between 60 and 120 cm.

11. The substrate processing apparatus according to claim 1, wherein the first module is provided with a first elevator to transfer a rack of substrates between a first lower region of the apparatus and the first module.

12. The substrate processing apparatus according to claim 11, wherein the first elevator comprises a moveable rack support arm having a bearing surface configured to support the substrate rack.

13. The substrate processing apparatus according to claim 11, wherein the first lower region of the apparatus is provided with a rack conveyor comprising an accommodation for racks and constructed and arranged to transfer racks between a plurality of rack positions in said first lower region.

14. The substrate processing apparatus according to claim 13, wherein the rack conveyor comprises a support platform having at least two cut-outs therein, the cut-outs being sized and shaped to allow a bearing surface of a rack support arm to translate vertically therethrough and to allow the platform to support a substrate rack.

15. The substrate processing apparatus according to claim 11, wherein the substrate handling robot is constructed and arranged to transfer substrates between a substrate cassette at a substrate transfer position and the rack in the first lower region.

16. The substrate processing apparatus according to claim 11, further comprising a gate valve provided between a substrate handler and the first lower region to create a minienvironment therein.

17. The substrate processing apparatus according to claim 16, wherein the minienvironment comprises a gas inlet and a gas outlet fluidly connected to a pump to provide a gas flow through the minienvironment.

18. The substrate processing apparatus according to claim 1, further comprising a wall separating a cassette handler and the substrate handling robot.

19. The substrate processing apparatus according to claim 1, further comprising an internal wall, wherein the internal wall comprises a closable substrate access opening.

20. A substrate processing apparatus, comprising:
- a housing comprising sidewalls and a back wall, the housing defining a first leg, a second leg, and an opening therebetween;
- a first module within the first leg and second module within the second leg;
- a door connecting the first leg and the second leg; and
- a substrate handling robot disposed within the housing and constructed and arranged to transfer substrates between a substrate cassette at a substrate transfer position and the first and second module,
wherein the substrate processing apparatus is constructed and arranged to allow maintenance of the substrate handling robot by a person standing in a maintenance area between the door and the substrate handling robot and between the first leg and the second leg, and the first and second modules are constructed and arranged to allow maintenance of the modules from the maintenance area.

* * * * *